(12) United States Patent
James et al.

(10) Patent No.: US 7,049,685 B2
(45) Date of Patent: May 23, 2006

(54) PACKAGED MICROELECTRONIC DEVICES WITH PRESSURE RELEASE ELEMENTS AND METHODS FOR MANUFACTURING AND USING SUCH PACKAGED MICROELECTRONIC DEVICES

(75) Inventors: Stephen L. James, Boise, ID (US); Chad A. Cobbley, Boise, ID (US)

(73) Assignee: Micron Technology, Inc., Boise, IA (US)

(*) Notice: Subject to any disclaimer, the term of this patent is extended or adjusted under 35 U.S.C. 154(b) by 55 days.

(21) Appl. No.: 10/099,155

(22) Filed: Mar. 13, 2002

(65) Prior Publication Data

US 2002/0175399 A1 Nov. 28, 2002

Related U.S. Application Data

(62) Division of application No. 09/645,640, filed on Aug. 24, 2000, now Pat. No. 6,979,595.

(51) Int. Cl.
*H01L 23/495* (2006.01)
*H01L 23/58* (2006.01)
*H01L 23/04* (2006.01)
*H01L 23/28* (2006.01)

(52) U.S. Cl. ............... 257/669; 257/683; 257/730; 257/787; 257/783; 257/676

(58) Field of Classification Search ........... 257/669, 257/683, 730, 787, 783, 676
See application file for complete search history.

(56) References Cited

U.S. PATENT DOCUMENTS

| | | |
|---|---|---|
| 3,672,046 A | 6/1972 | Storey, II et al. |
| 4,285,780 A | 8/1981 | Schachter |
| 4,769,344 A | 9/1988 | Sakai et al. |
| 4,777,520 A | 10/1988 | Nambu et al. |

(Continued)

FOREIGN PATENT DOCUMENTS

JP 60208847 A 10/1985

(Continued)

OTHER PUBLICATIONS

Peter Van Zant, *Microchip Fabrication*, Fourth Edition, McGraw-Hill, New York, Chapter 18, Packaging, Copyright 2000, pp. 557-593.

(Continued)

*Primary Examiner*—David E. Graybill
(74) *Attorney, Agent, or Firm*—Perkins Coie LLP

(57) ABSTRACT

Packaged microelectronic devices, interconnecting units for packaged microelectronic devices, and methods and apparatuses for packaging microelectronic devices with pressure release elements. In one aspect of the invention, a packaged microelectronic device includes a microelectronic die, an interconnecting unit coupled to the die, and a protective casing over the die. The interconnecting unit can have a substrate with a first side and a second side to which the die is attached, a plurality of contact elements operatively coupled to corresponding bond-pads on the die, and a plurality of ball-pads on the first side of the substrate electrically coupled to the contact elements. The protective casing can have at least a first cover encapsulating the die on the first side of the substrate. The packaged microelectronic device can also include a pressure relief element through at least a portion of the first cover and/or the substrate. The pressure relief element can have an opening to an external environment and a passageway to an internal location within the packaged microelectronic device. In operation, the pressure relief element releases gases or other forms of moisture entrapped by the casing and/or the substrate during high temperature processing of the packaged microelectronic device.

19 Claims, 7 Drawing Sheets

U.S. PATENT DOCUMENTS

| | | |
|---|---|---|
| 4,855,807 A | 8/1989 | Yamaji et al. |
| 4,866,506 A | 9/1989 | Nambu et al. |
| 4,882,212 A | 11/1989 | SinghDeo et al. |
| 4,887,149 A | 12/1989 | Romano |
| 5,107,328 A | 4/1992 | Kinsman |
| 5,128,831 A | 7/1992 | Fox, III et al. |
| 5,138,434 A | 8/1992 | Wood et al. |
| 5,147,821 A | 9/1992 | McShane et al. |
| 5,191,174 A | 3/1993 | Chang et al. |
| 5,195,023 A | 3/1993 | Manzione et al. |
| 5,197,183 A | 3/1993 | Chia et al. |
| 5,208,467 A | 5/1993 | Yamazaki |
| 5,266,748 A * | 11/1993 | Kawakami et al. ......... 174/262 |
| 5,296,738 A | 3/1994 | Freyman et al. |
| 5,309,026 A | 5/1994 | Matsumoto |
| 5,314,842 A | 5/1994 | Sawaya et al. |
| 5,363,280 A | 11/1994 | Chobot et al. |
| 5,365,655 A | 11/1994 | Rose |
| 5,474,958 A | 12/1995 | Djennas et al. |
| 5,527,743 A | 6/1996 | Variot |
| 5,578,261 A | 11/1996 | Manzione et al. |
| 5,593,927 A | 1/1997 | Farnworth et al. |
| 5,596,231 A | 1/1997 | Combs |
| 5,606,204 A | 2/1997 | Tsuji |
| 5,609,889 A | 3/1997 | Weber |
| 5,612,576 A | 3/1997 | Wilson et al. |
| 5,635,220 A | 6/1997 | Izumi et al. |
| 5,665,281 A | 9/1997 | Drummond |
| 5,665,296 A | 9/1997 | Jain et al. |
| 5,677,566 A | 10/1997 | King et al. |
| 5,696,033 A | 12/1997 | Kinsman |
| 5,710,071 A | 1/1998 | Beddingfield et al. |
| 5,721,450 A | 2/1998 | Miles |
| 5,728,600 A | 3/1998 | Saxelby, Jr. et al. |
| 5,739,585 A | 4/1998 | Akram et al. |
| 5,750,423 A | 5/1998 | Ishii |
| D394,844 S | 6/1998 | Farnworth et al. |
| 5,766,649 A | 6/1998 | Azuma |
| 5,767,446 A | 6/1998 | Ha et al. |
| 5,773,322 A | 6/1998 | Weld |
| 5,793,613 A | 8/1998 | Pionelli et al. |
| 5,796,159 A | 8/1998 | Kierse |
| 5,815,000 A | 9/1998 | Farnworth et al. |
| D402,638 S | 12/1998 | Farnworth et al. |
| 5,842,275 A | 12/1998 | McMillan, II et al. |
| 5,851,845 A | 12/1998 | Wood et al. |
| 5,866,953 A | 2/1999 | Akram et al. |
| 5,891,753 A | 4/1999 | Akram |
| 5,893,726 A | 4/1999 | Farnworth et al. |
| 5,898,224 A | 4/1999 | Akram |
| 5,917,234 A | 6/1999 | Tsuruzono |
| 5,920,768 A | 7/1999 | Shintai |
| 5,928,595 A | 7/1999 | Knapp et al. |
| 5,933,713 A | 8/1999 | Farnworth |
| 5,938,956 A | 8/1999 | Hembree et al. |
| 5,945,130 A | 8/1999 | Saxelby, Jr. et al. |
| 5,946,553 A | 8/1999 | Wood et al. |
| 5,958,100 A | 9/1999 | Farnworth et al. |
| 5,964,030 A | 10/1999 | Lee et al. |
| 5,986,209 A | 11/1999 | Tandy |
| 5,989,941 A | 11/1999 | Wensel |
| 5,990,566 A | 11/1999 | Farnworth et al. |
| 5,994,784 A | 11/1999 | Ahmad |
| RE36,469 E | 12/1999 | Wood et al. |
| 5,998,243 A | 12/1999 | Odashima et al. |
| 6,000,924 A | 12/1999 | Wang et al. |
| 6,008,070 A | 12/1999 | Farnworth |
| 6,013,946 A | 1/2000 | Lee et al. |
| 6,020,629 A | 2/2000 | Farnworth et al. |
| 6,025,728 A | 2/2000 | Hembree et al. |
| 6,028,365 A | 2/2000 | Akram et al. |
| 6,046,496 A | 4/2000 | Corisis et al. |
| 6,048,744 A | 4/2000 | Corisis et al. |
| 6,048,755 A | 4/2000 | Jiang et al. |
| 6,049,125 A | 4/2000 | Brooks et al. |
| 6,054,755 A | 4/2000 | Takamichi et al. |
| 6,066,514 A | 5/2000 | King et al. |
| 6,071,758 A | 6/2000 | Steffen |
| 6,072,236 A | 6/2000 | Akram et al. |
| 6,075,288 A | 6/2000 | Akram |
| 6,089,920 A | 7/2000 | Farnworth et al. |
| 6,094,058 A | 7/2000 | Hembree et al. |
| 6,097,087 A | 8/2000 | Farnworth et al. |
| 6,100,598 A | 8/2000 | Kanesaka |
| 6,103,547 A | 8/2000 | Corisis et al. |
| 6,107,122 A | 8/2000 | Wood et al. |
| 6,107,680 A | 8/2000 | Hodges |
| 6,114,189 A | 9/2000 | Chia et al. |
| 6,117,382 A | 9/2000 | Thummel |
| 6,124,634 A | 9/2000 | Akram et al. |
| 6,126,428 A | 10/2000 | Mitchell et al. |
| 6,143,581 A | 11/2000 | Johnson et al. |
| 6,150,717 A | 11/2000 | Wood et al. |
| 6,159,764 A | 12/2000 | Kinsman et al. |
| 6,168,970 B1 | 1/2001 | Burns |
| 6,172,419 B1 | 1/2001 | Kinsman |
| 6,175,159 B1 | 1/2001 | Sasaki |
| 6,184,465 B1 | 2/2001 | Corisis |
| 6,191,472 B1 | 2/2001 | Mazumder |
| 6,198,172 B1 | 3/2001 | King et al. |
| 6,208,519 B1 | 3/2001 | Jiang et al. |
| 6,210,992 B1 | 4/2001 | Tandy et al. |
| 6,215,175 B1 | 4/2001 | Kinsman |
| 6,228,548 B1 | 5/2001 | King et al. |
| 6,228,687 B1 | 5/2001 | Akram et al. |
| 6,229,202 B1 | 5/2001 | Corisis |
| 6,235,994 B1 | 5/2001 | Chamberlin et al. |
| 6,242,802 B1 | 6/2001 | Miles et al. |
| 6,246,108 B1 | 6/2001 | Corisis et al. |
| 6,252,298 B1 | 6/2001 | Lee et al. |
| 6,258,623 B1 | 7/2001 | Moden et al. |
| 6,258,624 B1 | 7/2001 | Corisis |
| 6,259,153 B1 | 7/2001 | Corisis |
| 6,262,480 B1 | 7/2001 | Ferri et al. |
| 6,277,671 B1 | 8/2001 | Tripard |
| 6,284,571 B1 | 9/2001 | Corisis et al. |
| 6,288,444 B1 * | 9/2001 | Abe et al. ................... 257/712 |
| 6,291,894 B1 | 9/2001 | Farnworth et al. |
| 6,291,895 B1 | 9/2001 | Taniguchi et al. |
| 6,294,839 B1 | 9/2001 | Mess et al. |
| 6,300,165 B1 | 10/2001 | Castro |
| 6,303,981 B1 | 10/2001 | Moden |
| 6,303,985 B1 | 10/2001 | Larson et al. |
| 6,309,916 B1 | 10/2001 | Crowley et al. |
| 6,310,390 B1 | 10/2001 | Moden |
| 6,314,639 B1 | 11/2001 | Corisis |
| 6,316,285 B1 | 11/2001 | Jiang et al. |
| 6,326,242 B1 | 12/2001 | Brooks et al. |
| 6,326,244 B1 | 12/2001 | Brooks et al. |
| 6,326,687 B1 | 12/2001 | Corisis |
| 6,326,697 B1 | 12/2001 | Farnworth |
| 6,326,698 B1 | 12/2001 | Akram |
| 6,329,220 B1 | 12/2001 | Bolken et al. |
| 6,329,603 B1 | 12/2001 | Japp et al. |
| 6,331,221 B1 | 12/2001 | Cobbley |
| 6,331,453 B1 | 12/2001 | Bolken et al. |
| 6,332,766 B1 | 12/2001 | Thummel |
| 6,338,813 B1 | 1/2002 | Hsu et al. |
| 6,403,009 B1 | 6/2002 | Saxelby, Jr. et al. |
| 6,413,801 B1 | 7/2002 | Lin |
| 6,472,252 B1 | 10/2002 | Mess |
| 6,483,044 B1 | 11/2002 | Ahmad |

| | | | |
|---|---|---|---|
| 2001/0038144 A1 | 11/2001 | Grigg | |
| 2002/0016023 A1 | 2/2002 | Bolken | |
| 2002/0048843 A1 | 4/2002 | Bolken | |
| 2002/0050654 A1 | 5/2002 | Bolken | |
| 2002/0052063 A1 | 5/2002 | Bolken | |
| 2003/0029633 A1 | 2/2003 | Ahmad | |
| 2003/0106709 A1 | 6/2003 | Ahmad | |
| 2003/0109083 A1 | 6/2003 | Ahmad | |

FOREIGN PATENT DOCUMENTS

| | | | |
|---|---|---|---|
| JP | 62032622 A | | 2/1987 |
| JP | 62229949 A | | 10/1987 |
| JP | 01244629 A | | 9/1989 |
| JP | 05299536 A | | 11/1993 |
| JP | 10-065043 A | | 3/1998 |
| JP | 11017048 A | | 1/1999 |
| JP | 11026489 A | | 1/1999 |
| JP | 11077733 A | | 3/1999 |
| JP | 2000106375 A | * | 4/2000 |
| JP | 2001/085565 A | | 3/2001 |
| JP | 20001076689 A | | 3/2001 |
| KR | 2001/038773 A | | 5/2001 |

OTHER PUBLICATIONS

U.S. Appl. No. 09/645,640, filed Aug. 25, 2000, James et al.
U.S. Appl. No. 09/595,623, filed Jun. 16, 2000, Bolken.
U.S. Appl. No. 09/649,428, filed Aug. 28, 2000, Cobbley.
U.S. Appl. No. 09/644,801, filed Aug. 23, 2000, Ahmad.

* cited by examiner

PACKAGED MICROELECTRONIC DEVICES WITH PRESSURE RELEASE ELEMENTS AND METHODS FOR MANUFACTURING AND USING SUCH PACKAGED MICROELECTRONIC DEVICES

CROSS REFERENCE TO RELATED APPLICATION

This application is a divisional of U.S. patent application Ser. No. 09/645,640, now U.S. Pat. No. 6,979,595, filed on Aug. 24, 2000.

TECHNICAL FIELD

The present invention relates to packaging microelectronic devices having a microelectronic die including an integrated circuit. More particularly, several aspects of the invention are related to releasing pressure within packaged microelectronic devices during high temperature processes, such as reflow processing and burn-in testing.

BACKGROUND

Microelectronic devices, such as memory devices and microprocessors, typically include a microelectronic die encased in a protective covering. The die can include memory cells, processor circuits, interconnecting circuitry and/or other functional features. The die also typically includes an array of very small bond-pads electrically coupled to the functional features. When the die is packaged, the bond-pads are coupled to leads, solder ball-pads or other types of terminals for operatively coupling the microelectronic dies to buses, circuits and/or other microelectronic devices.

Several different techniques have been developed for packaging microelectronic dies. The dies, for example, can be incorporated into individual packages, mounted with other components in hybrid or multiple chip modules, or connected directly to a printed circuit board or other types of substrates. When a die is incorporated into an individual package, the bond-pads on the die are typically coupled to a lead frame, and the die is covered or otherwise sealed from the environment. When the die is attached directly to a printed circuit board or another type of substrate, the bond-pads on the die are typically coupled to corresponding contact elements on the substrate using wire-bond lines, ball grid arrays and other techniques. The dies that are mounted directly to the substrates are generally Chip Scale Package devices (CSP) or Flip Chip Bare Die devices (Flip-Chip).

CSP and Flip-Chip devices generally have one or more protective casings that encapsulate the dies and any exposed contact elements, bond-pads or wire-bond lines. The protective casings should shield the die and the other components on the substrate from environmental factors (e.g., moisture), electrical interference, and mechanical shocks. The protective casings are accordingly robust elements that protect the sensitive components of a microelectronic device. The protective casings are generally composed of plastics, ceramics, or thermosetting materials.

One conventional technique for fabricating the protective casings involves placing the die in a cavity of a mold, and then injecting a thermosetting material into the cavity. The thermosetting material flows over the die on one side of the substrate until it fills the cavity, and then the thermosetting material is cured so that it hardens into a suitable protective casing for protecting the die. According to conventional practices, the protective casing should not have any voids over the die because contaminants from the molding process or environmental factors outside of the mold could damage the die. The thermosetting material, moreover, should not cover a ball-pad array on the substrate or damage any electrical connections between the die and the substrate. Therefore, according to conventional practices, the thermosetting material should be molded in a manner that avoids (a) producing voids in the protective casing, (b) covering certain portions of the substrate with the thermosetting material, and (c) displacing or otherwise damaging any wire-bond lines or solder joints between the die and the substrate.

One drawback of packaging microelectronic devices is that during high-temperature processing cracks or voids can form in the protective casing, or the protective casing can delaminate from the substrate. Such cracking or delamination, for example, may occur during a solder reflow procedure in which the packaged microelectronic devices are quickly heated to reflow solder balls and/or or solder paste pads. This problem is particularly noticeable in procedures that quickly heat the packaged devices to an elevated temperature. When the casing of a packaged microelectronic device cracks or delaminates from the substrate, the device is often rejected because such cracks or voids can expose very delicate components (e.g., bond-pads or wire-bond lines) to external environmental factors. It will be appreciated that such cracking of the casing results in extremely expensive losses because it occurs at the end of the fabrication process after a significant amount of money has been expended to manufacture each packaged microelectronic device. Therefore, it would be desirable to develop an apparatus and method for reducing or completely preventing the casing from cracking or delaminating from the substrate during high temperature processing.

SUMMARY

The present invention is directed toward packaged microelectronic devices and methods for making and using such packaged microelectronic devices. In one aspect of the invention, a packaged microelectronic device includes a microelectronic die, an interconnecting unit coupled to the die, and a protective casing over the die. The microelectronic die, for example, may have an integrated circuit and a bond-pad array having a plurality of bond-pads operatively coupled to the integrated circuit. The interconnecting unit has a substrate with a first side and a second side to which the die is attached, a plurality of contact elements operatively coupled to corresponding bond-pads on the die, and a plurality of ball-pads on the first side of the substrate. The interconnecting unit can also include a plurality of conductive elements extending from selected contact elements to corresponding ball-pads to electrically couple the contact elements to the ball-pads. The protective casing can have at least a first cover encapsulating the die on the first side of the substrate.

The packaged microelectronic device can also include a pressure relief element through at least a portion of the first cover and/or the substrate. The pressure relief element can have an opening to an external environment and a passageway to an internal location or interior point within the packaged microelectronic device. The pressure relief element, for example, can be a hole or opening through the substrate to an adhesive strip on the bottom side of the die. In another embodiment, the pressure relief element is a hole through the first cover to either the substrate or the microelectronic die. In still another embodiment, the pressure relief element is a depression that extends only part way through the cover or the substrate such that the passageway forms a thin section of the first cover or the substrate. In operation, the pressure relief element releases gases or other forms of moisture entrapped by the casing and/or the substrate during high temperature processing of the packaged microelectronic device.

DETAILED DESCRIPTION OF THE ILLUSTRATED EMBODIMENTS

The following disclosure is directed toward packaged microelectronic devices, interconnecting units for packaged microelectronic devices, and methods for manufacturing and using packaged microelectronic devices. Several embodiments of the invention are described with reference to memory devices, but the methods and apparatuses are also applicable to microprocessors and other types of devices. One skilled in the art will accordingly understand that the present invention may have additional embodiments, or that the invention may be practiced without several of the details described below.

Figure 1:
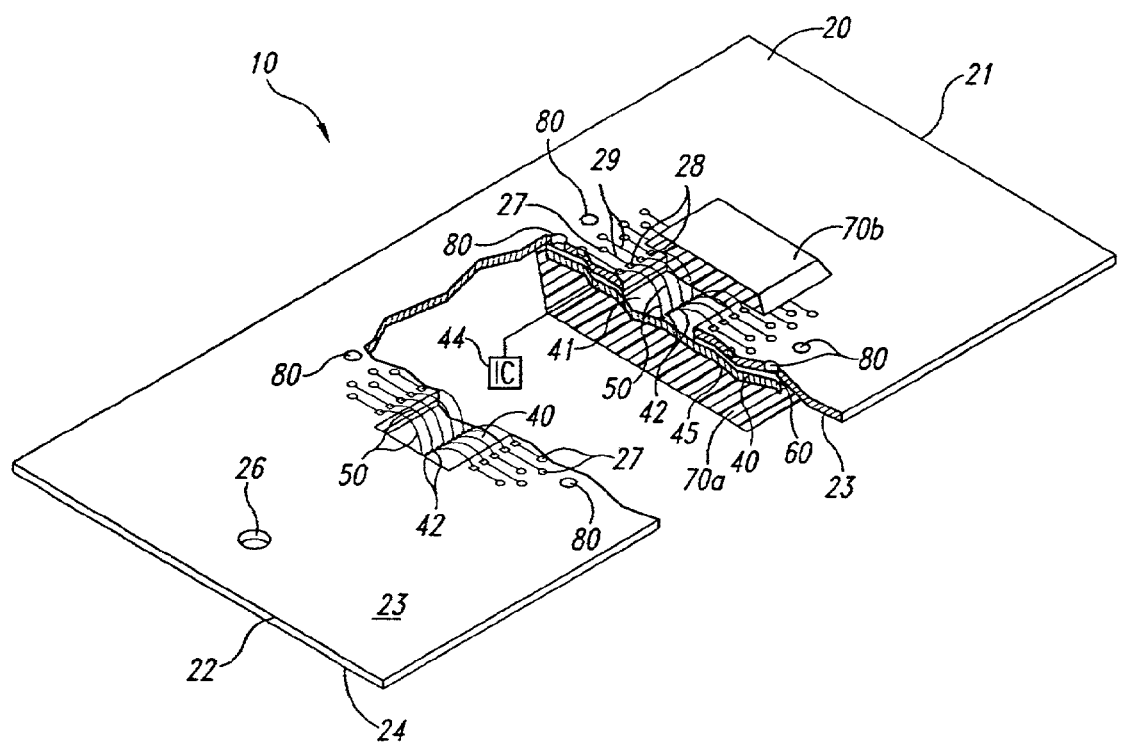
FIG. 1 is a top cut-away isometric view illustrating a portion of a microelectronic device in accordance with an embodiment of the invention.

FIG. 1 is a top cut-away isometric view of a microelectronic device 10 in accordance with one embodiment of the invention. The microelectronic device 10 can include a substrate 20 and a microelectronic die 40 attached to the substrate 20 by an adhesive strip 60. The following description is directed toward encapsulating a microelectronic die on a flexible substrate, but it is expected that several embodiments of the methods and apparatuses in accordance with the present invention may be practiced to encapsulate a large variety of electrical and/or non-electrical articles. Therefore, the following description with respect to encapsulating the microelectronic die 20 shown in FIGS. 1–7B is for purpose of illustration only, and it is not intended to limit the scope of the invention.

The embodiment of the substrate 20 shown in FIG. 1 can have a first end 21, a second end 22 opposite the first end 21, a first surface 23, and a second surface 24 opposite the first surface 23. The substrate 20 can also include an elongated slot 25 between the first and second surfaces 23 and 24 that extends lengthwise along a medial portion of the substrate 20. Additionally, an aperture 26 through the substrate 20 can be located at a secondary gate location generally proximate to the second end 22 of the substrate 20. The substrate 20 is one component of an interconnecting unit that provides an array of ball-pads for coupling very small bond-pads on the microelectronic die 40 to voltage sources, signal sources, and/or other input/output sources. In the embodiment shown in FIG. 1, the substrate 20 includes an array of ball-pads 27, an array of contact elements 28 proximate to the slot 25, and a trace 29 or another type of conductive line between each ball-pad 27 and a corresponding contact element 28. The substrate 20 can be a flexible material or a substantially rigid material, and the traces 29 can be conductive lines that are printed on the substrate in a manner similar to printed circuit boards.

The embodiment of the microelectronic die 40 shown in FIG. 1 includes a front side 41, a plurality of bond-pads 42 on the front side 41, and an integrated circuit 44 (shown schematically). The front side 41 of the die 40 is attached to the second surface 24 of the substrate 20 by an adhesive strip 60. The bond-pads 42 are coupled to the integrated circuit 44, and the bond-pads 42 are also arranged in an array along the front side 41 of the microelectronic die 40 so that the bond-pads 42 are aligned with or otherwise accessible through the slot 25 in the substrate 20. A plurality of wire-bond lines 50 or other types of connectors couple the bond-pads 42 on the die 40 to corresponding contact elements 28 on the substrate 20. As such, the substrate 20 distributes the very small bond-pads 42 to the larger array of ball-pads 27. The die 40 projects away from the second surface 24 of the substrate 20 such that a backside 45 of the die 40 is spaced apart from the second surface 24 of the substrate 20.

The microelectronic device 10 can further include a protective casing having a first cover 70a over the die 40 and a second cover 70b over the slot 25. The first and second covers 70a and 70b can be formed from a thermosetting material, ceramics, or other suitable materials. The first and second protective covers 70a and 70b can be molded as explained in U.S. patent application Ser. No. 09/255,554, which is herein incorporated by reference.

The embodiment of the microelectronic device 10 shown in FIG. 1 also includes a plurality of pressure relief elements 80 that are configured to release a gas entrapped in the microelectronic device 10. The substrate 20 and/or the adhesive strip 60 can absorb moisture, and the first and second covers 70a and 70b can entrap this moisture in the area around the die 40. When the microelectronic device 10 is quickly heated in a solder reflow process or another high-temperature procedure, the entrapped moisture expands and creates a pressure gradient in the microelectronic device 10. The pressure relief elements 80 provide a path through which the expanding gas can escape without cracking the covers 70a or 70b, delamninating the substrate 20 and/or the covers 70a or 70b, or otherwise damaging the microelectronic device 10.

Figure 2A:
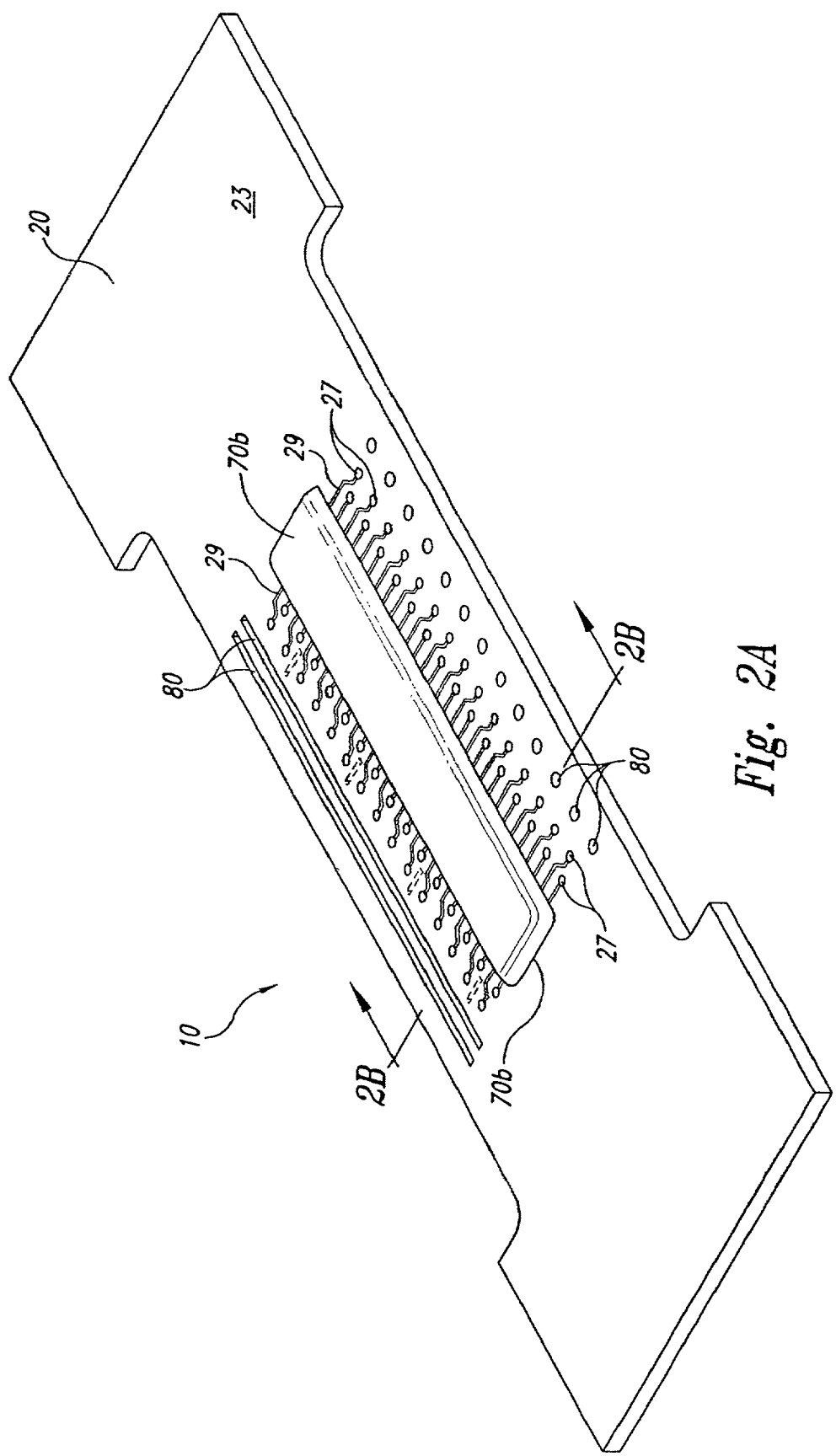
FIG. 2A is a top isometric view of the microelectronic device of FIG. 1.
Figure 2B:
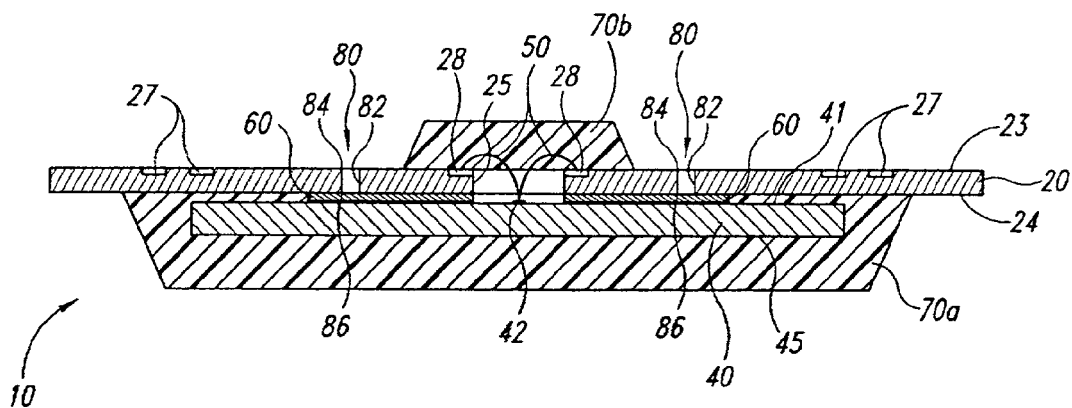
FIG. 2B is a front cross-sectional view of the microelectronic device of FIG. 2A.

FIG. 2A is a top isometric view and FIG. 2B is a front cross-sectional view that illustrate various embodiments of the pressure relief elements 80 in further detail. Referring to FIG. 2A, the pressure relief elements 80 can be a series of passageways completely through the substrate 20 at an area outside of the ball-pads 27. The pressure relief elements 80 can be of elongated channels (shown on one side of the cover 70b), or the pressure relief elements 80 can be holes (shown on the other side of the second cover 70b). The pressure relief elements 80 can also be shorter elongated channels or slots that fit between the ball-pads 27 and the traces 29 (shown in broken lines). In a typical application, the pressure relief elements 80 will be either elongated channels on both sides of the second cover 70b, or a series of holes on both sides of the second cover 70b (as shown in FIG. 1). Referring to FIG. 2B, the pressure relief elements 80 include a passageway 82 having a first end defined by an opening 84 at an external location and a second end at an interior point 86 of the microelectronic device 10. In the particular embodiment shown in FIG. 2B, the opening 84 is at the first surface 23 of the substrate 20 and the interior point 86 is at the second surface 24 of the substrate 20.

The pressure relief elements 80 of the embodiment shown in FIG. 2B are also positioned over the adhesive strip 60 to expose a portion of the adhesive 60 to the external environment. The location of the pressure relief elements 80 is generally selected to provide a passageway to internal locations within the substrate where moisture is likely to be entrapped. Thus, as explained in more detail below, the pressure relief elements 80 can be configured to allow moisture to escape from the substrate 20, the adhesive 60, the covers 70a and 70b, and/or any combination of these components.

The pressure relief elements 80 shown in FIGS. 1–2B can be formed by etching or laser cutting the substrate 20 before attaching the adhesive 60 to the second surface 24 of the substrate 20. The pressure relief elements 80, for example, can be etched by masking the substrate 20 with a photo resist and etching through the substrate 20 with a suitable etchant. Similarly, a laser can cut through the substrate 20 using techniques that are known in the art. The pressure relief elements 80 can also be formed by mechanically drilling (e.g., gang drilling), punching, stamping, or molding the holes or slots in the substrate 20.

The microelectronic device 10 is particularly well suited for use in high temperature post-encapsulation processes, such as solder reflow processing and burn-in testing. When the microelectronic device 10 is subject to a process that rapidly increases the temperature, the expansion of the moisture entrapped in the substrate 20, the adhesive 60, and/or the first and second covers 70a and 70b generates a pressure gradient in the internal region of the microelectronic device 10. The adhesive tape 60, for example, is particularly subject to absorbing moisture, and thus a pressure gradient typically forms in the region of the adhesive 60 during high temperature processing. The pressure relief elements 80 allow the moisture in the tape 60 and the other components of the device 10 to diffuse out of the device 10 before large pressure gradients are created in the substrate 20 or the first and second covers 70a and 70b. The pressure relief elements 80 are accordingly expected to inhibit or completely prevent cracking or delaminating of the covers 70a and 70b during high temperature processing.

Figure 3:
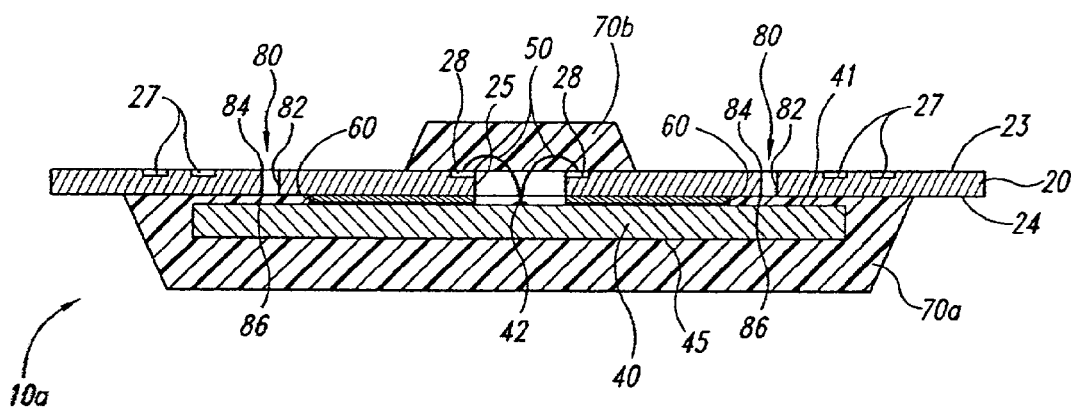
FIG. 3 is a front cross-sectional view of a microelectronic device in accordance with another embodiment of the invention.

FIG. 3 is a front cross-sectional view of a microelectronic device 10a in accordance with another embodiment of the invention. In this embodiment, the microelectronic device la includes a substrate 20, a die 40 attached to the substrate 20 by an adhesive 60, and the first and second covers 70a and 70b. The microelectronic device 10a can also include a plurality of pressure relief elements 80 that are defined by passageways 82 extending through the substrate 20. Unlike the microelectronic device 10 in which the passageways 82 extend to the adhesive 60, the pressure relief elements 80 of the microelectronic device 10 are defined by passageways 82 that extend from the first surface 23 of the substrate 20 to the second surface 24 of the substrate 20 at a location over the first cover 70a and spaced apart from the adhesive 60. The microelectronic device 10a accordingly provides pressure relief elements 80 for allowing moisture to diffuse out of the substrate 20 and the first cover 70a during high temperature processing. In another embodiment, the pressure relief elements 80 shown in FIGS. 2B and 3 are combined in a single microelectronic device having a first plurality of pressure relief elements 80 that expose the adhesive 60 to the external environment (FIG. 2A) and a second plurality of pressure relief elements 80 expose the interior of the first cover 70a to an external environment (FIG. 3).

Figure 4A:
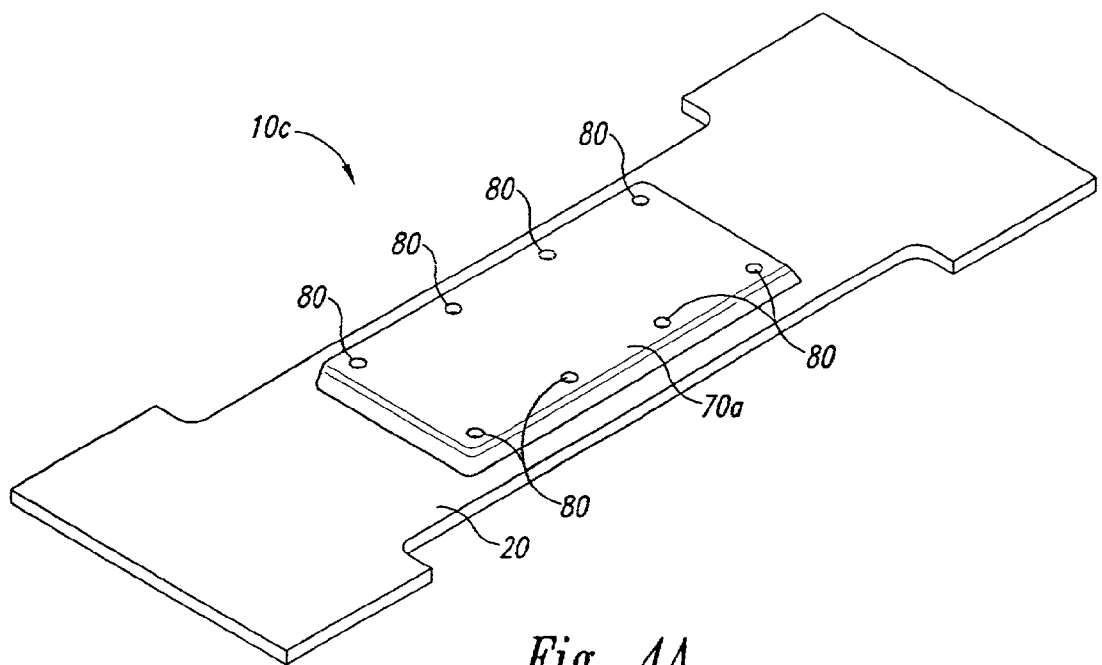
FIG. 4A is a bottom isometric view.
Figure 4B:
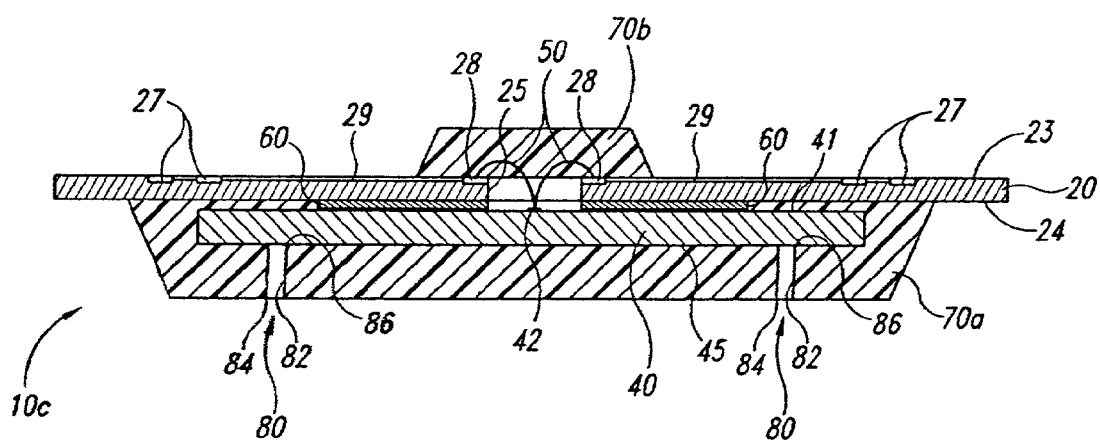
FIG. 4B is a front cross-sectional view of a microelectronic device in accordance with another embodiment of the invention.

FIG. 4A is a bottom isometric view and FIG. 4B is a front cross-sectional view of a microelectronic device 10c in accordance with another embodiment of the invention. Referring to FIG. 4A, the microelectronic device 10c has a plurality of pressure relief elements 80 extending through the first cover 70a. Referring to FIG. 4B, the pressure relief elements 80 can be a series of passageways 82 extending through a top portion of the first cover 70a. Each passageway 82 can have an opening 84 exposed to external environment and an interior point 86 at the backside 45 of the die 40. In operation, the pressure relief elements 80 shown in FIG. 4B allow moisture to escape from the first cover 70a during high temperature processing.

Figure 5A:
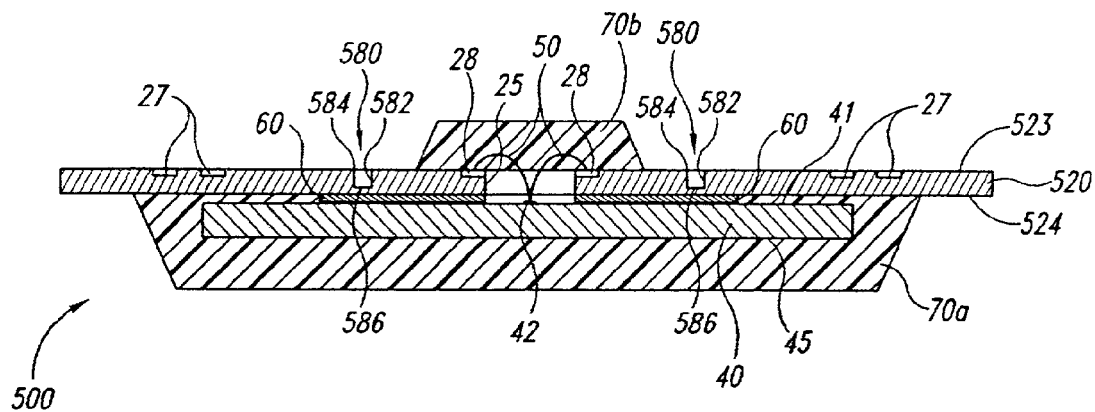
FIGS. 5A and 5B are front cross-sectional views of a microelectronic device in accordance with another embodiment of the invention.
Figure 5B:
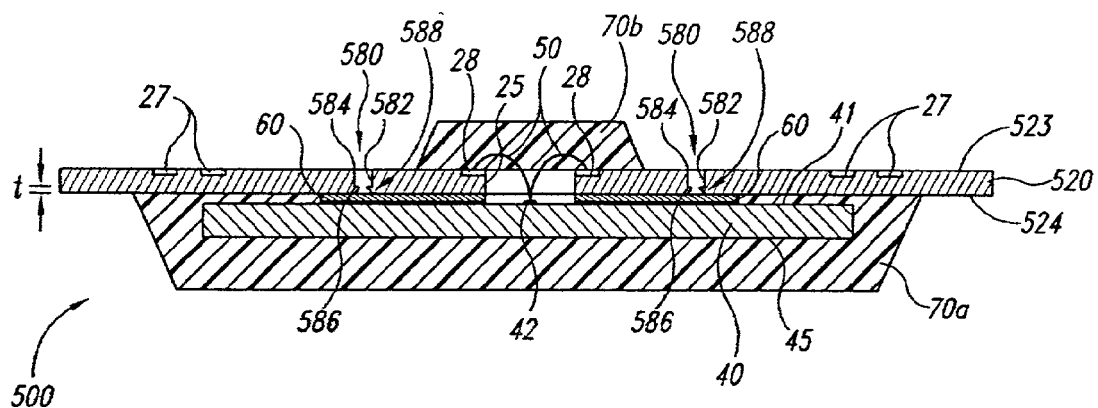

FIGS. 5A and 5B are front cross-sectional views of a microelectronic device 500 in accordance with another embodiment of the invention. Referring to FIG. 5A, the microelectronic device 500 includes a substrate 520 having a first surface 523 and a second surface 524. The die 40 is attached to the second surface 524 of the substrate 520, the first cover 70a encases the die 40, and the second cover 70b encases the bond-pads 42 and the wire-bond lines 50 at the first surface 523 of the substrate 520. Several components of the microelectronic device 500 can be similar to the components of the microelectronic device 10 shown in FIG. 2B, and thus like reference numbers refer to like components in FIGS. 2B, 5A and 5B. The substrate 520, for example, can also have a slot 25, a plurality of contact elements 28 adjacent to the slot 25, a plurality of ball-pads 27 spaced apart from the contact elements 28, and a plurality of conductive elements electrically coupling selected contact elements to corresponding ball-pads 27.

The microelectronic device 500 can also include a plurality of pressure relief elements 580 through a portion of the substrate 520. In the embodiment illustrated in FIG. 5A, the pressure relief elements 580 are depressions 582 that have an opening 584 at the first surface 523 on the substrate 520 and an interior point 586 proximate to the second surface 524 of the substrate 520. The depressions 582 do not extend completely through the substrate 520 such that the interior point 586 of the pressure relief elements 580 is at an intermediate depth in the substrate 520. The pressure relief elements 580 can be superimposed over the adhesive strips 60 (shown in FIG. 5A), or the pressure relief 580 can be located over the first cover 70a in a manner similar to the pressure relief elements 80 shown in FIG. 3.

FIG. 5B illustrates the operation of the pressure relief elements 580 in the microelectronic device 500. As the microelectronic device 500 is heated during a high temperature process, the expanding moisture in the adhesive 60, the substrate 520, and/or the covers 70a and 70b can rupture the thin section of the substrate 520 at the interior point 586 of a passageway 582 to form a via 588 through which the expanding gas can escape. The pressure relief elements 580 accordingly act as pressure relief valves that rupture to prevent the pressure gradient from becoming so large that it cracks or otherwise delaminates the first or second covers 70a or 70b. The thickness "t" of the thin section of the substrate 520 between the interior point 586 and the second surface 524 can accordingly be selected to rupture and form the via 588 at a pressure that is less than the failure pressure of the first and second covers 70a and 70b.

The pressure relief elements 580 can also be fabricated by laser cutting, etching, drilling, stamping, embossing, or molding the substrate 520. A laser, for example, can have a residence time that does not penetrate through the substrate 520 but rather only forms the depression 582 without passing through the second surface 524. Suitable laser and etching techniques that can form a controlled depression are known in the art.

Figure 6A:
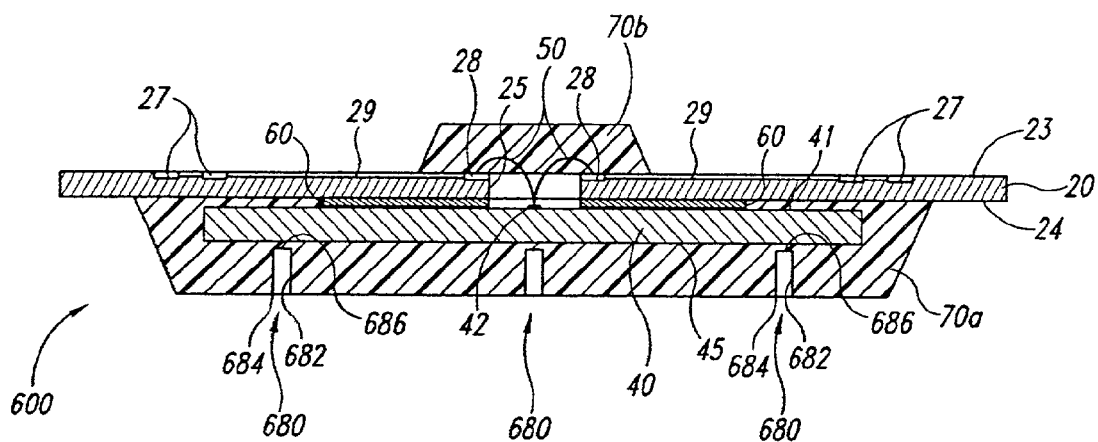
FIGS. 6A and 6B are front cross-sectional views of a microelectronic device in accordance with still another embodiment of the invention.
Figure 6B:
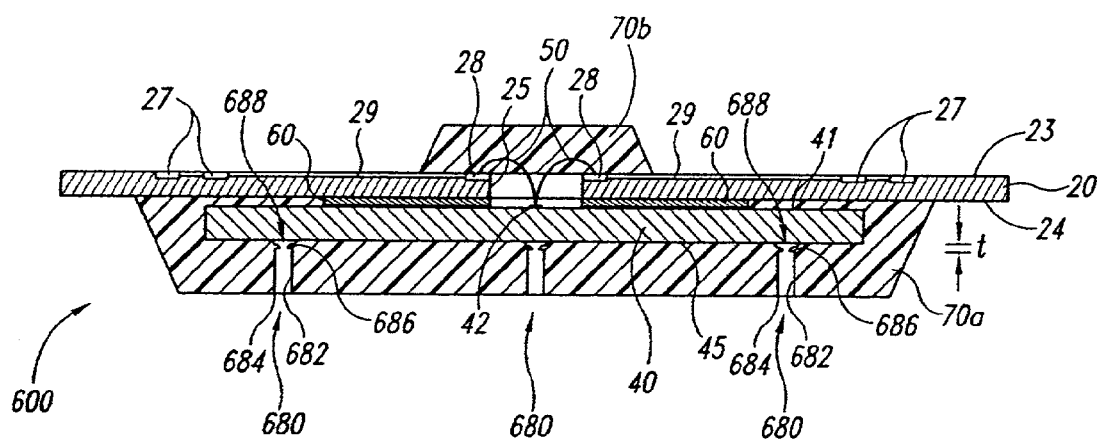

FIGS. 6A and 6B are front cross-sectional views of a microelectronic device 600 in accordance with yet another embodiment of the invention. Several components of the microelectronic device 600 can be similar to the components of the microelectronic device 10 shown in FIG. 2B, and thus like reference numbers refer to like parts in FIGS. 2B, 6A and 6B. The microelectronic device 600 can also include a plurality of pressure relief elements 680 through a portion of the first cover 70a. The pressure relief elements 680, for example, can be a plurality of depressions 682 having an opening 684 and an interior point 686. The opening 684 is exposed to external environment, and the interior point 686 is at an intermediate depth in the first cover 70a. Referring to FIG. 6B, the thin section of the first cover 70a between the interior point 686 and the backside 45 of the die 40 can rupture during a high temperature process to relieve pressure in the first cover 70a. The left-most pressure relief element 680a in FIG. 6B, for example, illustrates a ruptured pressure relief element 680 that forms a via 688 through which high pressure gas can escape from the microelectronic device 600. As set forth above, the thickness t of the first cover 70a between the back side 45 of the die 40 and the interior point 686 of the pressure relief element 680 can be selected to rupture at a predetermined pressure that is less than the failure pressure of the thicker portion of the cover 70a. As such, the pressure relief elements 680 can act as pressure relief valves that are positioned at predetermined failure sites to relieve pressure within the microelectronic device 600 before the first cover 70a or the second cover 70b cracks or has another type of catastrophic failure.

Figure 7:
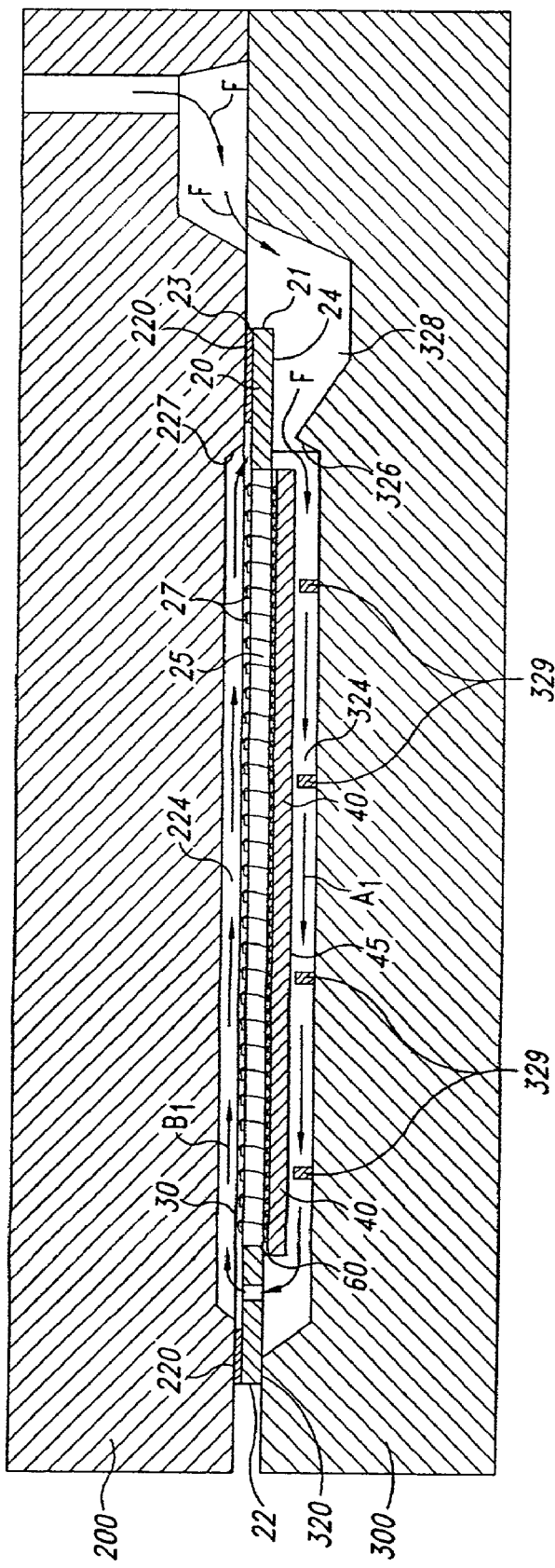
FIG. 7 is a side cross-sectional view of a microelectronic device and a mold assembly used to form a protective casing with pressure relief elements in accordance with an embodiment of the invention.

FIG. 7 is a side cross-sectional view of a mold assembly and a method for forming the first cover 70a for the microelectronic device 600 shown in FIGS. 6A and 6B. The mold assembly can include a first mold section 200 and a second mold section 300. The first mold section 200 has a bearing surface 220 and a wire-side cavity 224, and the second mold section 300 has a bearing surface 320, a die-side cavity 324, and a plurality of posts 329 in the die-side cavity 324. The wire-side cavity 224 is configured to form the second cover 70b over the slot 25 of the substrate 20, and the die-side cavity 324 is configured to form the first cover 70a over the die 40. The second mold section 300 can also include a gate 326 and an injection chamber 328 through which a flow F of mold compound (e.g., thermosetting material) is injected into the die-side cavity 324.

During the molding process, the substrate 20 is positioned between the first and second mold sections 200 and 300 to align the die 40 with the die-side cavity 324 and to align the slot 25 with the wire-side cavity 224. The bearing surface 320 of the second mold section 300 presses against the second surface 24 of the substrate 20, and the bearing surface 220 of the first mold section 200 can press against the first surface 23 of the substrate 20. The bearing surface 220 of the first mold section 200 can engage the first surface 23 of the substrate 20 by injecting a mold compound into the die-side cavity 324, as explained in U.S. patent application Ser. No. 09/255,554. The flow of mold compound F initially passes through gate 326 of the second mold section 300 and continues into the die-side cavity 324 to create a first flow $A_1$ of mold compound heading in a first direction toward the second end 22 of the substrate 20. The first flow $A_1$ of mold compound passes through the aperture 26 in the substrate 20 to generate a second flow $B_1$ of mold compound that flows through the wire-side cavity 224 of the first mold section 200. The second flow $B_1$ of mold compound fills the slot 25 of the substrate 20 and flows in a second direction until it reaches a terminal end 227 of the wire-side cavity 224. When the mold compound sufficiently fills the die-side cavity 324 and the wire-side cavity 224, the post 329 in the die-side cavity 324 form the pressure relief elements 680 in the first cover 70a shown in FIGS. 6A and 6B. Similarly, to form the pressure relief elements 80 in the first cover 70a shown in FIG. 4B, the posts 329 can be lengthened so that they engage the back side 45 of the substrate 40 when the bearing surface 320 of the second mold section 300 engages the second surface 24 of the substrate 20.

From the foregoing it will be appreciated that specific embodiments of the invention have been disclosed for purposes of enablement and illustration, but that various modifications may be made without deviating from the spirit and scope of the invention. For example, certain embodiments of the pressure relief elements 80 shown in FIGS. 2A–3 or the pressure relief elements 580 shown in FIGS. 5A and 5B can also relieve pressures caused by mechanical stresses as a result of the different coefficients of thermal expansion for the different components of the microelectronic device 10. The substrate 20 generally has a different coefficient of thermal expansion than the molding compound of the first and second covers 70a and 70b. The microelectronic device 10 generally has a low level of internal mechanical stress at room temperature because the first and second covers 70a and 70b shrink after cooling from the molding process. During high temperature processing, however, the microelectronic substrate 10 can have high internal mechanical stresses because the first and second covers 70a and 70b can expand much more than the substrate 20. The elongated pressure relief elements 80 shown on the one side of the cover 70b in FIG. 2A are expected to reduce the internal mechanical stresses caused by different thermal expansion/contraction characteristics of the different components in the microelectronic device 10 because the elongated pressure relief elements 80 act as expansion joints. Thus, the term pressure relief element can include structures that provide a path through which gas can escape from the microelectronic device, that relieve internal mechanical stresses caused by different thermal expansion/contraction characteristics, and/or that control or otherwise dissipate other internal stresses in microelectronic devices. Accordingly, the invention is not limited except by the appended claims.

The invention claimed is:

1. A packaged microelectronic device, comprising:
   a microelectronic die having an integrated circuit and a bond-pad array having a plurality of bond-pads operatively coupled to the integrated circuit;
   an interconnecting unit having a substrate with a first side and a second side to which the die is attached, a plurality of contact elements operatively coupled to corresponding bond-pads on the die, a plurality of ball-pads on the first side, and a plurality of conductive elements extending from selected contact elements to corresponding ball-pads;

a protective casing having at least a first cover encapsulating the die on the second side of the substrate; and a plurality of pressure relief elements through at least a portion of the first cover, the individual pressure relief elements having an opening to an external environment and a passageway to an internal location.

2. A packaged microelectronic device, comprising:

a microelectronic die having an integrated circuit and a bond-pad array having a plurality of bond-pads operatively coupled to the integrated circuit;

an interconnecting unit having a substrate with a first side and a second side to which the die is attached, a plurality of contact elements operatively coupled to corresponding bond-pads on the die, a plurality of ball-pads on the first side, and a plurality of conductive elements extending from selected contact elements to corresponding ball-pads;

a protective casing having at least a first cover encapsulating the die on the second side of the substrate; and a plurality of pressure relief elements through at least a portion of the first cover and/or the substrate, the individual pressure relief elements having an opening to an external environment and a passageway to an internal location, wherein each pressure relief element is a depression in the first cover and/or the substrate that does not pass completely through the first cover and/or the substrate such that the opening is at an external side of the first cover and/or the substrate and the internal location is at an intermediate depth within the first cover and/or the substrate, the first cover and/or the substrate having a thickness between the internal location and the second side that is configured to rupture at a predetermined pressure.

3. The device of claim 2 wherein:

the microelectronic die is attached to the second side of the substrate by an adhesive; and the depressions are over the adhesive.

4. The device of claim 1 wherein the individual pressure relief elements are holes completely through the first cover such that the internal location is at a backside of the die.

5. The device of claim 1 wherein the individual pressure relief elements are depressions in the first cover that do not pass completely through the first cover such that the internal location is at an intermediate depth within the first cover, the first cover having a thickness between the internal location and a backside of the die that is configured to rupture at a predetermined pressure.

6. A packaged microelectronic device, comprising:

a microelectronic die having an integrated circuit and a bond-pad array having a plurality of bond-pads operatively coupled to the integrated circuit;

an interconnecting unit having a substrate with a first side and a second side to which the die is attached, a plurality of contact elements operatively coupled to corresponding bond-pads on the die, a plurality of ball-pads on the first side, and a plurality of conductive elements extending from selected contact elements to corresponding ball-pads;

a protective casing having at least a first cover encapsulating the die on the second side of the substrate; and a plurality of pressure relief elements through at least a portion of the first cover, the individual pressure relief elements being configured to release a gas entrapped by the casing.

7. A packaged microelectronic device, comprising:

a microelectronic die having an integrated circuit and a bond-pad array having a plurality of bond-pads operatively coupled to the integrated circuit;

an interconnecting unit having a substrate with a first side and a second side to which the die is attached, a plurality of contact elements operatively coupled to corresponding bond-pads on the die, a plurality of ball-pads on the first side, and a plurality of conductive elements extending from selected contact elements to corresponding ball-pads;

a protective casing having at least a first cover encapsulating the die on the second side of the substrate; and a plurality of pressure relief elements through at least a portion of the first cover and/or the substrate, the individual pressure relief elements being configured to release a gas entrapped by the casing and/or the substrate, wherein each pressure relief element is a depression in the first cover and/or the substrate that does not pass completely through the first cover and/or the substrate such that the opening is at an external side of the first cover and/or the substrate and the internal location is at an intermediate depth within the first cover and/or the substrate, the first cover and/or the substrate having a thickness between the internal location and the second side that is configured to rupture at a predetermined pressure.

8. The device of claim 7 wherein:

the microelectronic die is attached to the second side of the substrate by an adhesive; and the depressions are over the adhesive.

9. The device of claim 6 wherein the individual pressure relief elements are holes completely through the first cover such that the internal location is at a backside of the die.

10. The device of claim 6 wherein the individual pressure relief elements are depressions in the first cover that do not pass completely through the first cover such that the internal location is at an intermediate depth within the first cover, the first cover having a thickness between the internal location and a backside of the die that is configured to rupture at a predetermined pressure.

11. A packaged microelectronic device, comprising:

an interconnecting unit having a substrate with a first side and a second side, a slot defining an open region between the first and second sides, a plurality of contact elements on the first side and adjacent to the slot, a plurality of ball-pads on the first side, and a plurality of conductive elements on the first side extending from selected contact elements to corresponding ball-pads;

a microelectronic die having an integrated circuit and a plurality of bond-pads operatively coupled to the integrated circuit, the die being attached to the second side of the substrate, and the bond-pads being aligned with the slot;

a plurality of wire-bond lines in the slot extending between selected bond-pads on the die and corresponding contact elements on the substrate;

a protective casing having a first cover encapsulating the die on the second side of the substrate and a second cover encapsulating the bond-pads, the wire-bond lines and the contact elements; and a pressure relief element through at least a portion of the first cover and/or the substrate, the pressure relief element being configured to release a gas entrapped by the casing and/or the substrate.

12. The device of claim 11 wherein the pressure relief element is a depression in the substrate that does not pass completely through the substrate such that the opening is at the first side of the substrate and the internal location is at an intermediate depth within the substrate, the substrate having a thickness between the internal location and the second side that is configured to rupture at a predetermined pressure.

13. The device of claim 12 wherein:
the microelectronic die is attached to the second side of the substrate by an adhesive; and
the depression is over the adhesive.

14. The device of claim 11 wherein the pressure relief element is a depression in the first cover that does not pass completely through the first cover such that the internal location is at an intermediate depth within the first cover, the first cover having a thickness between the internal location and a backside of the die that is configured to rupture at a predetermined pressure.

15. An interconnecting unit for use in packaging a microelectronic device, comprising:
a substrate with a first side and a second side, the second side being configured to receive the die;
an adhesive attached to the second side of the substrate;
a contact array with a plurality of contact elements on the first side and/or the second side;
a ball-pad array with a plurality of ball-pads on the first side;
a plurality of conductive elements extending from selected contact elements to corresponding ball-pads; and
a pressure relief element through at least a portion of the substrate positioned at a location apart from the contact elements and over the adhesive, the pressure relief element having an opening at the first side of the substrate and an internal location at least proximate to the second side of the substrate such that the adhesive is exposed to the external environment.

16. The unit of claim 15 wherein the pressure relief element is a hole completely through the substrate such that the opening is at the first side of the substrate and the internal location is at the second side of the substrate.

17. The unit of claim 15 wherein the pressure relief element is an elongated channel completely through the substrate such that the opening is at the first side of the substrate and the internal location is at the second side of the substrate.

18. An interconnecting unit for use in packaging a microelectronic device, comprising:
a substrate with a first side and a second side, the second side being configured to receive the die;
a contact array with a plurality of contact elements on the first side and/or the second side;
a ball-pad array with a plurality of ball-pads on the first side;
a plurality of conductive elements extending from selected contact elements to corresponding ball-pads; and
a pressure relief element through at least a portion of the substrate positioned at a location apart from the contact elements, the pressure relief element having an opening at the first side of the substrate and an internal location at least proximate to the second side of the substrate, wherein the pressure relief element is a depression in the substrate that does not pass completely through the substrate such that the opening is at the first side of the substrate and the internal location is at an intermediate depth within the substrate, the substrate having a thickness between the internal location and the second side configured to rupture at a predetermined pressure.

19. The unit of claim 18 wherein:
the interconnecting unit further comprises an adhesive attached to the second side of the substrate; and
the depression is over the adhesive.

* * * * *

UNITED STATES PATENT AND TRADEMARK OFFICE
CERTIFICATE OF CORRECTION

PATENT NO. : 7,049,685 B2 Page 1 of 1
APPLICATION NO. : 10/099155
DATED : May 23, 2006
INVENTOR(S) : Stephen L. James et al.

It is certified that error appears in the above-identified patent and that said Letters Patent is hereby corrected as shown below:

Column 4
Line 56, "delamninating" should be --delaminating--;

Column 5
Line 57, "la" should be --10a--;

Signed and Sealed this

Fourth Day of March, 2008

JON W. DUDAS
*Director of the United States Patent and Trademark Office*